(12) United States Patent
Lin et al.

(10) Patent No.: US 12,347,504 B2
(45) Date of Patent: Jul. 1, 2025

(54) ONE-TIME-PROGRAMMABLE MEMORY DEVICES

(71) Applicants: Taiwan Semiconductor Manufacturing Company, Ltd., Hsinchu (TW); National Tsing Hua University, Hsinchu (TW)

(72) Inventors: Chrong Jung Lin, Hsinchu (TW); Ya-Chin King, Hsinchu (TW); Li-Yu Wang, Hsinchu (TW)

(73) Assignees: TAIWAN SEMICONDUCTOR MANUFACTURING COMPANY, LTD., Hsinchu (TW); NATIONAL TSING HUA UNIVERSITY, Hsinchu (TW)

( * ) Notice: Subject to any disclaimer, the term of this patent is extended or adjusted under 35 U.S.C. 154(b) by 124 days.

(21) Appl. No.: 18/328,091

(22) Filed: Jun. 2, 2023

(65) Prior Publication Data

US 2024/0404611 A1  Dec. 5, 2024

(51) Int. Cl.
*G11C 17/16* (2006.01)
*G11C 17/18* (2006.01)
*H10B 20/25* (2023.01)

(52) U.S. Cl.
CPC .............. *G11C 17/16* (2013.01); *G11C 17/18* (2013.01); *H10B 20/25* (2023.02)

(58) Field of Classification Search
CPC .................. G11C 17/16; H10B 20/25
USPC ........................................... 365/96
See application file for complete search history.

(56) References Cited

U.S. PATENT DOCUMENTS

| | | | | |
|---|---|---|---|---|
| 11,791,005 B2* | 10/2023 | Chang | ................ | G11C 16/08 365/225.7 |
| 2003/0026158 A1* | 2/2003 | Knall | ................ | H10B 20/25 257/E27.071 |
| 2003/0179011 A1* | 9/2003 | Goodbread | ........ | G11C 17/165 257/E23.149 |
| 2013/0286759 A1* | 10/2013 | Park | ................ | G11C 29/027 365/201 |
| 2021/0125678 A1* | 4/2021 | Cho | ............ | G11C 17/18 |

FOREIGN PATENT DOCUMENTS

TW  202201420 A  1/2022

OTHER PUBLICATIONS

Office Action issued in connection with Taiwan Appl. No. 112146609 dated Aug. 26, 2024.

* cited by examiner

*Primary Examiner* — Muna A Techane
(74) *Attorney, Agent, or Firm* — Maschoff Brennan (57) ABSTRACT

A memory device includes a memory array comprising a plurality of one-time-programmable (OTP) memory cells. Each of the plurality of OTP memory cells comprises a select transistor, a diode, and a conductor fuse. The diode and the conductor fuse are coupled in series, with the select transistor coupled to a common node between the diode and the conductor fuse.

20 Claims, 11 Drawing Sheets

ONE-TIME-PROGRAMMABLE MEMORY DEVICES

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A one-time-programmable (OTP) memory device is one type of the non-volatile memory device utilized in integrated circuits for adjusting the circuitry after fabrication of an integrated circuit. For example, the OTP memory device is used for providing repair information that controls the usage of redundant cells in replacing defective cells of a memory array. Another use is for tuning analog circuitry by trimming a capacitive or resistive value of an analog circuit or enabling and disabling portions of the system. A recent trend is that the same product is likely to be manufactured in different fabrication facilities though in a common process technology. Despite best engineering efforts, it is likely that each facility will have a slightly different process. Usage of OTP memory devices allows independent optimization of the product functionality for each manufacturing facility.

As integrated circuit technology advances, integrated circuit features (e.g., the sizes and dimensions of transistors) have been decreasing, thereby allowing for more circuitry to be implemented in an integrated circuit. While implementing an OTP memory device such as, for example, a fuse, an electronic fuse (efuse), etc., in an integrated circuit, the OTP memory device is configured as a one-transistor-one-resistor (1T1R) structure. Such a structure can encounter various challenges. For example, to successfully program (burn out or otherwise break) the resistor, which functions as a fuse line of the OTP memory device, a large programming current is typically desirable, and thus, the corresponding transistor is typically made in a relatively large size. This can make integration of these OTP memory devices to advanced integrated circuits significantly challenging. Even through some other structures (e.g., 1T2R) have been proposed, such a 1T2R structure can still suffer large disturb current, which ultimately limits a total size of the OTP memory devices. Thus, the existing OTP memory devices have not been entirely satisfactory in many aspects.

The present disclosure provides various embodiments of an OTP memory device that includes a number of efuse memory cells, each of which is implemented as a one-transistor-one-resistor-one-diode (1T1R1D) structure. In various embodiments, the efuse memory cell, implemented as the disclosed 1T1R1D structure, includes a conductor fuse (function as a fuse resistor) and a diode connected to each other in series, and further includes a select transistor connected to a common node between the conductor fuse and the diode. With the diode connected to the conductor fuse, an additional conduction path is provided when the corresponding efuse memory cell is selected to be accessed (e.g., programmed). The diode can thus serve as a current divider, in some embodiments. As such, the select transistor is not necessarily to carry the whole amount of programming current, which allows the select transistor to be formed smaller (compared with existing 1T1R structure). Further, when the efuse memory cell is not selected, its corresponding diode is reverse-biased, which can significantly depress disturb current from flowing through the unselected efuse memory cell. Accordingly, the OTP memory device can have a relatively large number of the efuse memory cells configured in the 1T1R1D structure, while suffering almost zero disturb current across the whole OTP memory device.

Figure 1:
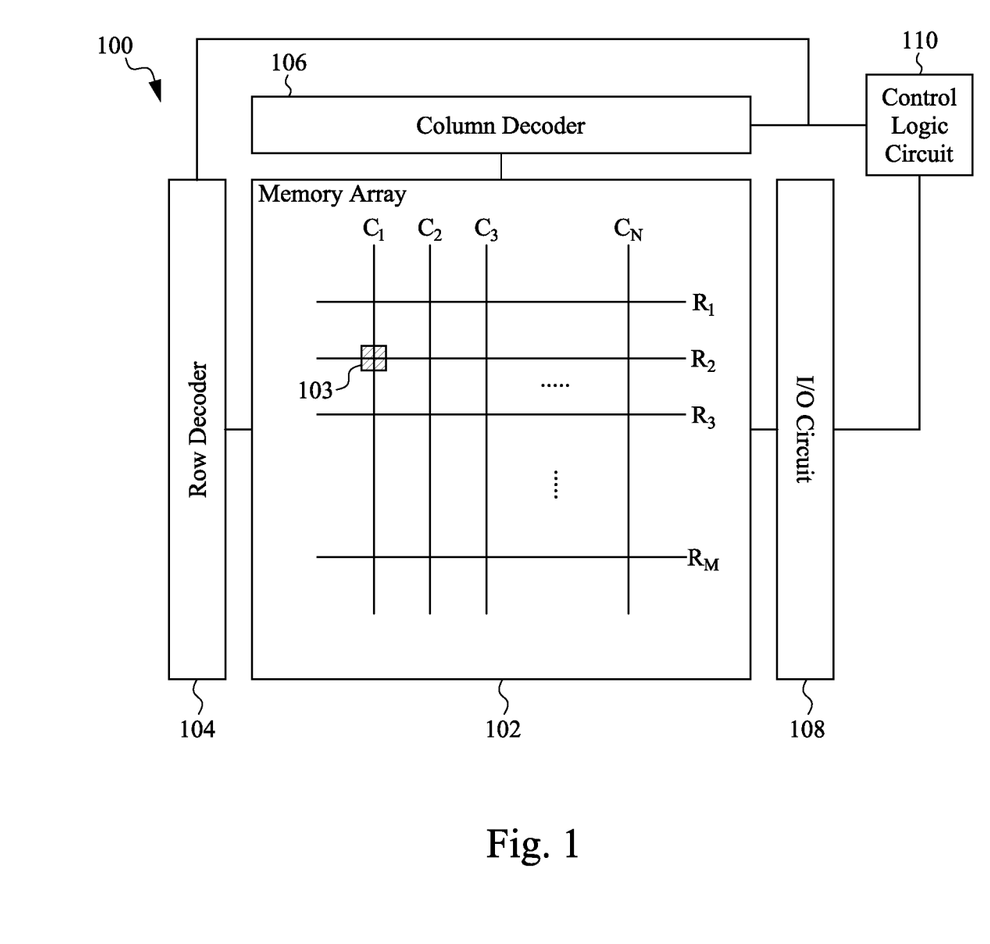
FIG. 1 illustrates a block diagram of a memory device, in accordance with some embodiments.

FIG. 1 illustrates an example block diagram of a semiconductor (e.g., memory) device 100, in accordance with various embodiments. In the illustrated embodiment of FIG. 1, the memory device 100 includes a memory array 102, a row decoder 104, a column decoder 106, an input/output (I/O) circuit 108, and a control logic circuit 110. Despite not being explicitly shown in FIG. 1, the components of the memory device 100 may be operatively coupled to each other and to the control logic circuit 110. For example, the control logic circuit 110, the I/O circuit 108, the column decoder 106, and the row decoder 104 may be operatively (e.g., electrically) coupled to the memory array 102, in some embodiments. Although, in the illustrated example of FIG. 1, the component are shown as separate blocks for the purpose of clear illustration, in some other embodiments, some or all of the components shown in FIG. 1 may be integrated together. For example, the memory array 102 may include an embedded I/O circuit 108.

The memory array 102 is a hardware component that stores data. In one aspect, the memory array 102 is embodied as a semiconductor memory device. The memory array 102 includes a plurality of memory cells (or otherwise storage units) 103. The memory array 102 includes a number of rows $R_1, R_2, R_3 \ldots R_M$, each extending in a first direction (e.g., X-direction) and a number of columns $C_1, C_2, C_3 \ldots C_N$, each extending in a second direction (e.g., Y-direction). Each of the rows/columns may include one or more conductive structures functions as access lines (e.g., word lines (WLs), bit lines (BLs), source lines (SLs), etc.). In some embodiments, each memory cell 103 is arranged in the intersection of a corresponding row and a corresponding column and can be operated according to voltages or currents through the respective conductive structures of the column and row.

In accordance with various embodiments of the present disclosure, each memory cell 103 is implemented as a one-time-programmable (OTP) memory cell, e.g., an efuse memory cell. Further, the efuse memory cell includes a fuse resistor, a select transistor, and a diode, which is sometimes referred to as being configured in a one-transistor-one-resistor-one-diode (1T1R1D) structure. The select transistor can be coupled to (e.g., gated by) a WL. The select transistor can be turned on/off to enable/disable an access (e.g., program, read) to the corresponding fuse resistor. For example, upon being selected, the select transistor of the selected efuse memory cell is turned on to generate a first program or read path conducting through its fuse resistor and itself. Further, with the diode connected to the fuse resistor, a second program or read path conducting through the fuse resistor and the diode is also available, when the efuse memory cell is selected. As such, even fabricating the select transistor in a relatively small size, programming efficiency of the memory cell 103 is not compromised. Detailed descriptions on the memory cell 103, configured as a efuse memory cell (herein referred to as efuse memory cell 103), will be discussed below with respect to FIG. 2.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a bit line, a source line) at that column address. The I/O circuit 108 is a hardware component that can access (e.g., read, program) each of the memory cells 103 asserted through the row decoder 104 and column decoder 106. The control logic circuit 110 is a hardware component that can control the coupled components (e.g., 102 through 108).

Figure 2:
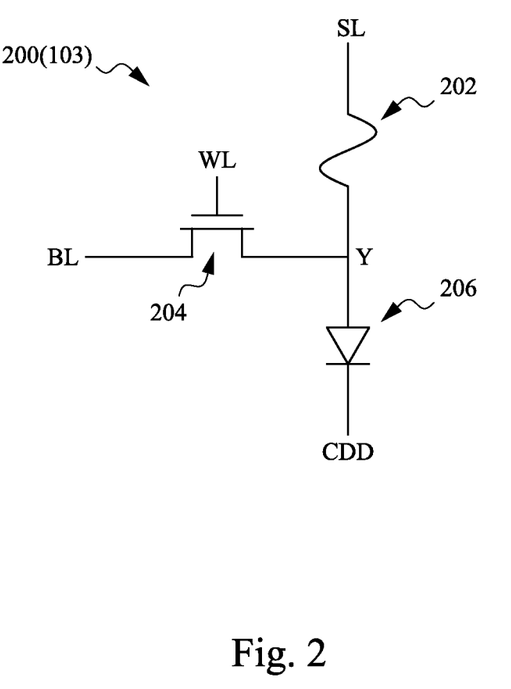
FIG. 2 illustrates an example configuration of an efuse memory cell of the memory device of FIG. 1, in accordance with some embodiments.

FIG. 2 illustrates an example configuration of an efuse memory cell 200 (e.g., efuse memory cell 103 of FIG. 1) having decent programming efficiency while being formed in a relatively small size, in accordance with some embodiments. In the example of FIG. 2, the efuse memory cell 200 is configured in a one-transistor-one-resistor-one-diode (1T1R1D) structure. For example, the efuse memory cell 200 includes a fuse resistor 202, a select transistor 204, and a diode 206. The fuse resistor 202 is connected to the select transistor 204 in series, with the diode 206 connected to a common node between the fuse resistor 202 and the select transistor 204. It, however, should be understood that any of various other fuse configurations that exhibit the fuse characteristic may be used by the efuse memory cell 200, while remaining within the scope of the present disclosure.

In various embodiments of the present disclosure, the fuse resistor 202 has a first terminal connected to a source line (SL), and a second terminal (denoted as node "Y") connected to both the select transistor 204 and the diode 206. The select transistor 204 has a gate terminal connected to a word line (WL), a first source/drain terminal connected to the node Y (i.e., the second terminal of the fuse resistor 202), and a second source/drain terminal connected to an anode of the diode 206, while a cathode of the diode 206 is connected to a current-divider line (CDD). Stated another way, the fuse resistor 202 can be conducted to the BL and CDD through the select transistor 204 and the diode 206, respectively.

The fuse resistor 202, the select transistor 204, and the diode 206 may be formed on the same side of a substrate, e.g., the frontside of a semiconductor substrate. For example, the select transistor 204 and the diode 206 can be formed along the frontside surface of a semiconductor substrate, which is sometimes referred to as part of front-end-of-line (FEOL) processing/network. Over the FEOL processing on the frontside of the substrate, a number of metallization layers, each of which includes a number of interconnect (e.g., metal) structures, are formed, which are sometimes referred to as part of back-end-of-line (BEOL) processing/network. The fuse resistor 202 may be formed of one or more of the metal structures in one of the metallization layers that are disposed above the select transistor 204.

With the fuse resistor 202 embodied as a (frontside) metal structure, the fuse resistor 202 may present an initial resistance value (or resistivity), for example, as fabricated. To program the efuse memory cell 200 (e.g., by permanently switching the initial resistance value of the fuse resistor 202 to a relatively large resistance value), the select transistor 204 (if embodied as a p-type transistor) is turned on by applying a (e.g., voltage) signal, corresponding to a logic low state, through the BL. Concurrently or subsequently, a high enough voltage signal (sometimes referred to as "Vprogram") is applied on one of the terminals of the fuse resistor 202 through the SL. With the select transistor 204 turned on, a first conduction (e.g., programming) path can be provided from the SL, through the fuse resistor 202 and the turned-on select transistor 204, and to the BL. Further, by connecting the CDD (i.e., the cathode of the diode 206) to ground, the diode 206 is forward-biased. Thus, a second conduction (e.g., programming) path can be provided from the SL, through the fuse resistor 202 and the diode 206, to the CDD.

Consequently, the fuse resistor 202 can transition from a first state (e.g., a short circuit) to a second state (e.g., an open circuit), which causes the efuse memory cell 200 to irreversibly transition from a first logic state (e.g., logic 0) to a second logic state (e.g., logic 1). The logic state can be read out by applying a relatively low voltage signal on the SL and turning on the select transistor 204 to provide a first conduction (e.g., reading) path and a second conduction (e.g., reading) path through the select transistor 204 and diode 206, respectively.

Figure 3:
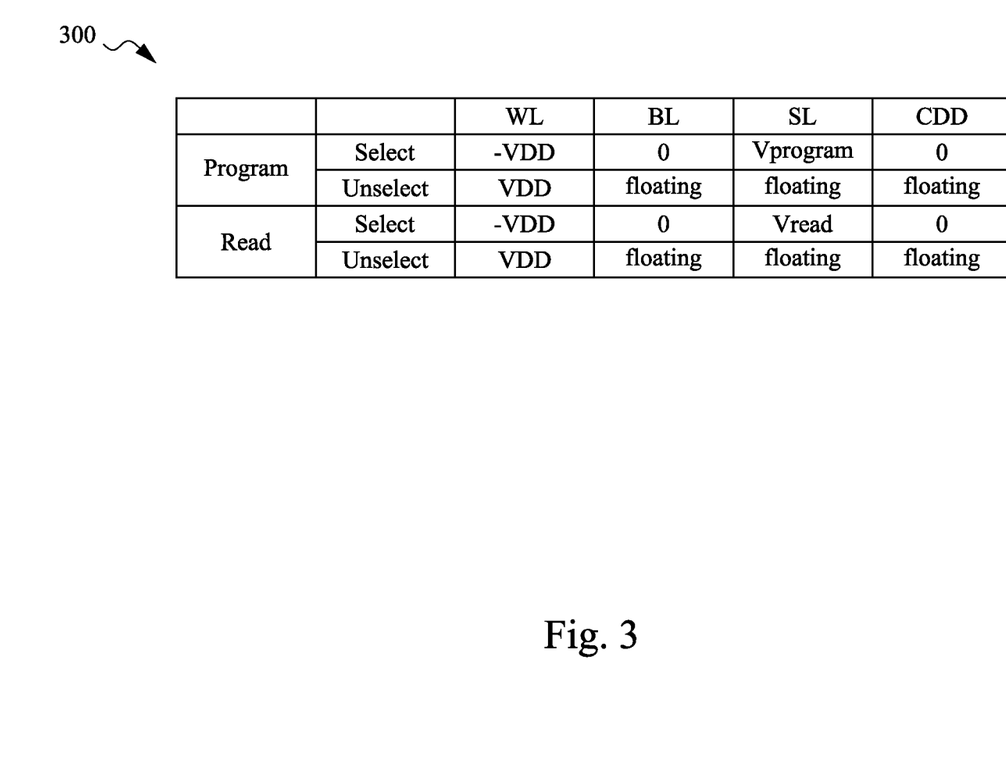
FIG. 3 illustrates a table listing example signals to operate the efuse memory cell of FIG. 2, in accordance with some embodiments.

FIG. 3 illustrates a table 300 summarizing example signals that can be applied to the WL, BL, SL, and CDD of each of a selected one and an unselected one of the disclosed efuse memory cells, respectively, in accordance with some embodiments. The polarity of the signals corresponds to a conductive type of the select transistor 204 (which is implemented as a p-type transistor), and thus, it should be noted that the polarity may change in other embodiments, while remaining within the scope of the present disclosure.

As shown, when the disclosed efuse memory cell is selected to be programmed, the voltage signals applied to the WL, BL, SL, and CDD are equal to "−VDD," "0," "Vprogram," and "0," respectively. Similarly, when the disclosed efuse memory cell is selected to be read, the voltage signals applied to the WL, BL, SL, and CDD are equal to "−VDD," "0," "Vread," and "0," respectively. As such, the diode 206 of the selected efuse memory cell is forward-biased, which can divide a portion of the current flowing through the corresponding fuse resistor 202. On the other hand, when the disclosed efuse memory cell is not selected to be programmed, the voltage signals applied to the WL, BL, SL, and CDD are equal to "VDD," "floating," "floating," and "floating," respectively. Similarly, when the disclosed efuse memory cell is not selected to be read, the voltage signals applied to the WL, BL, SL, and CDD are equal to "VDD," "floating," "floating," and "floating," respectively. As such, the diode 206 of the unselected efuse memory cell is reverse-biased, which can significantly suppress a current flowing through the corresponding fuse resistor 202.

Figure 4:
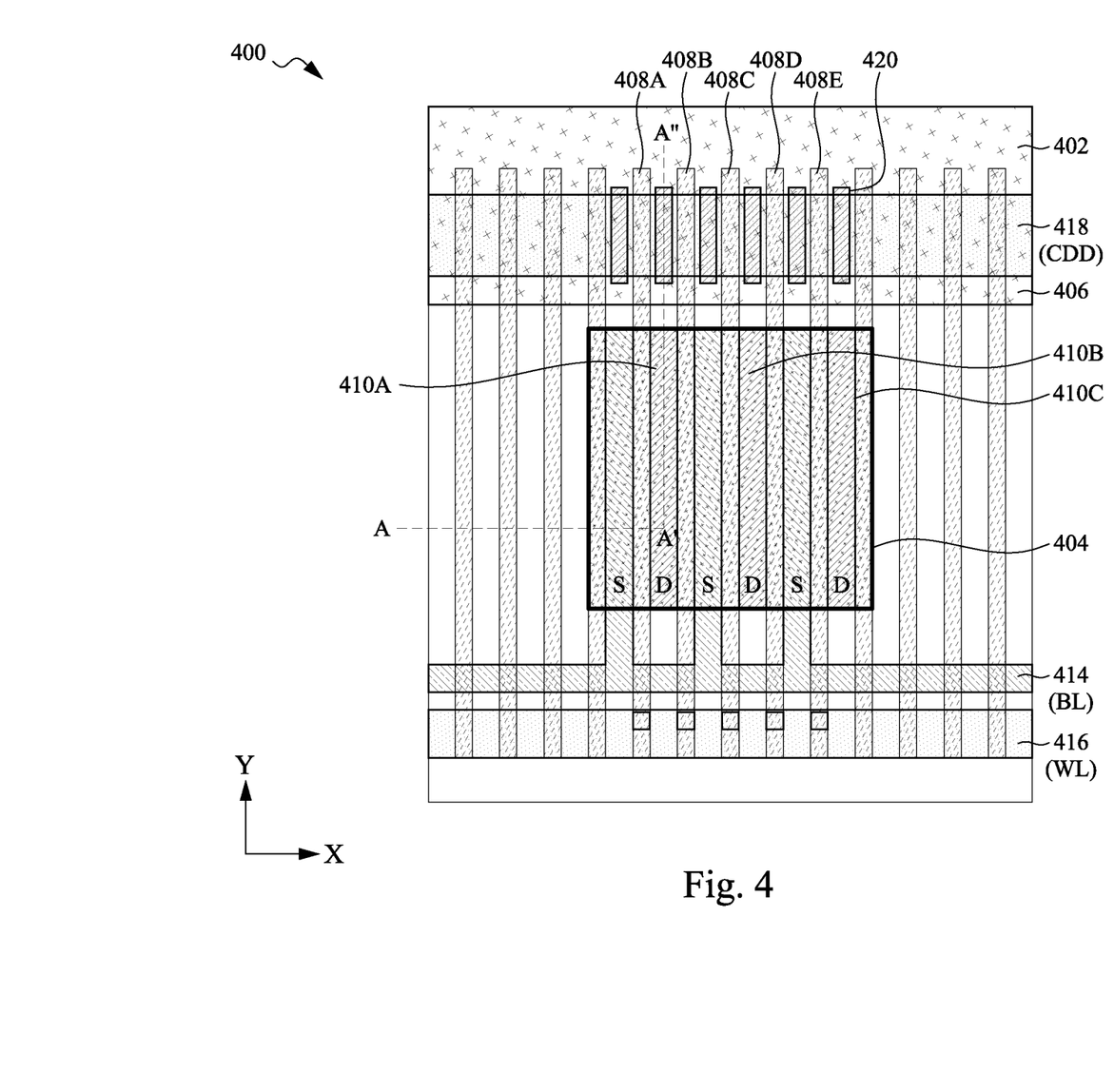
FIGS. 4 and 5 illustrate a layout to form the efuse memory cell of FIG. 2, in accordance with some embodiments.
Figure 5:
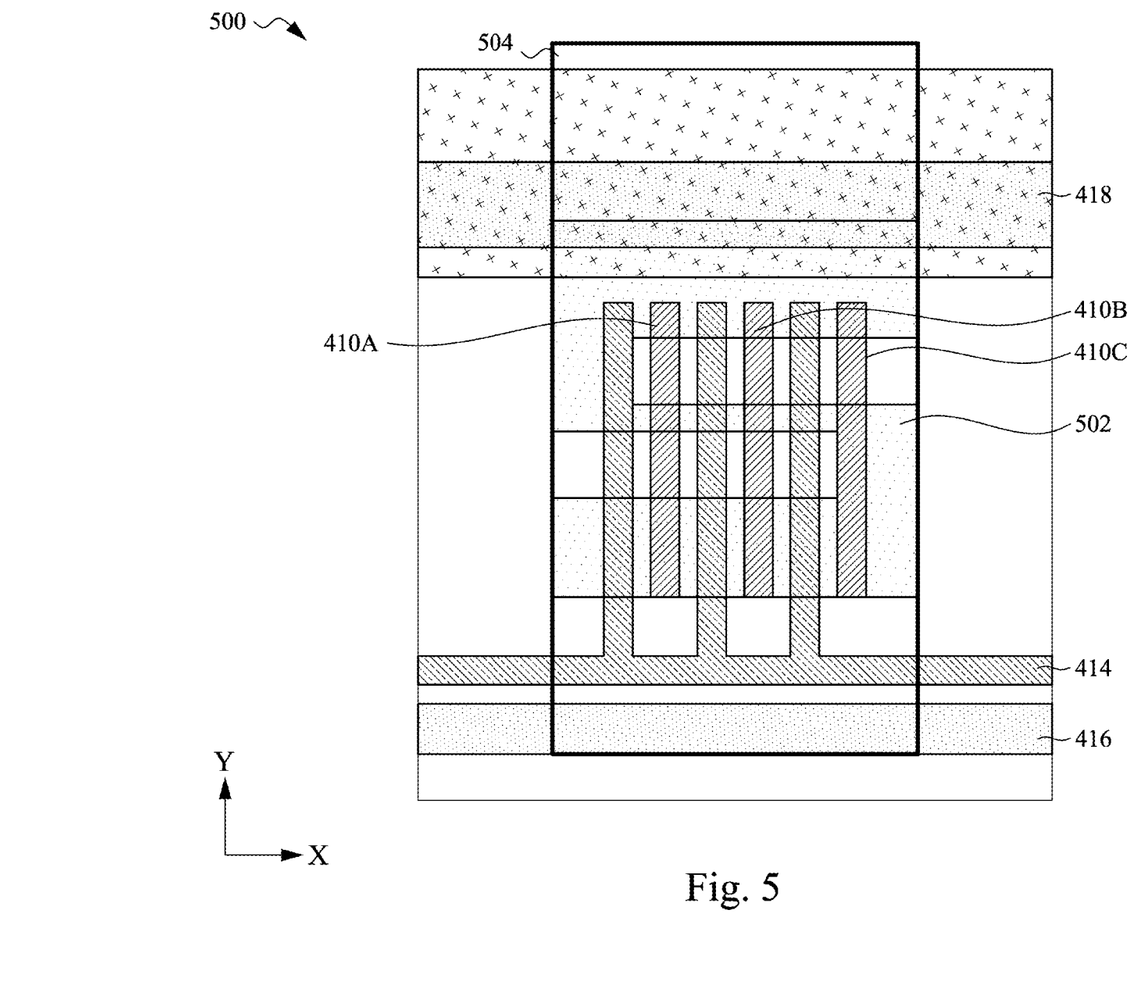

FIG. 4 and FIG. 5 illustrate a first part 400 and a second part 500 of a layout to form the disclosed efuse memory cell (e.g., configured in the 1T1R1D structure) and corresponding access lines (e.g., BL, WL, SL, CDD), in accordance with some embodiments. Hereinafter, the first part 400 and second part 500 are referred to as "layout 400" and "layout 500," respectively. Specifically, the layout 400 may be used in FEOL processing (e.g., to form the select transistor 204 and diode 206) and part of BEOL processing (e.g., to form the WL, BL, and CDD); and the layout 500 may be used in BEOL processing (e.g., to form the fuse resistor 202 and the SL).

Referring first to FIG. 4, the layout 400 includes patterns 402, 404, and 406 configured to form an n-well, a p+-well, and an n+-well, respectively. Hereinafter, the patterns 402, 404 and 406 are referred to as "NW 402," "P+W 404," and "N+W 406," respectively. The layout 400 further includes patterns a plural number of patterns 408 (e.g., 408A, 408B, 408C, 408D, and 408E) configured to form a plural number of gate structures, respectively. The patterns 408 extend in the Y-direction across the NW 402, P+W 404, and N+W 406. Hereinafter, the patterns 408A to 408E are referred to as "gate structure 408A," "gate structure 408B," "gate structure 408C," "gate structure 408D," and "gate structure 408E," respectively.

The wells 402 to 406 and gate structures 408A to 408E are typically formed in FEOL processing. The select transistor 204 and the diode 206 can be formed by such FEOL structures. For example, the gate structures 408A to 408E, and the NW 402 and P+W 404 can form the select transistor 204; and the P+W 404 and N+W 406 (together with the interposed NW 402) can form the diode 206. Specifically, a portion of the NW 402, overlaid by each of the gate structures 408A to 408E, can function as the channel of a sub-transistor of the select transistor 204, and portions of the P+W 404 on the opposite sides of each of the gate structures 408A to 408E can function as a source terminal and a drain terminal of the corresponding sub-transistor. The select transistor 204 can be operatively constructed by a plural number of such sub-transistors coupled to one another in parallel, in some embodiments. As indicated in FIG. 4, the drain terminal (D) and source terminal(S) of a first sub-transistor are formed on the right-hand side and left-hand side of the gate structure 408A, respectively; the drain terminal (D) and source terminal(S) of a second sub-transistor are formed on the left-hand side and right-hand side of the gate structure 408B, respectively; the drain terminal (D) and source terminal(S) of a third sub-transistor are formed on the right-hand side and left-hand side of the gate structure 408C, respectively; and so on. Further, the P+W 404 can serve as the anode of the diode 206, while the N+W 406 can serve as the cathode of the diode 206.

Referring still to FIG. 4, the layout 400 includes patterns 410A, 410B, and 410C configured to form a number of middle-end interconnect structures, respectively. Such interconnect structures are connected to the drain terminals of the sub-transistors (equivalently the drain terminal of the select transistor 204). Such a middle-end interconnect structure is sometimes referred to as an MD. Hereinafter, the patterns 410A, 410B and 410C are referred to as "MD 410A," "MD 410B," and "MD 410C," respectively. These MDs 410A-C allow the drain terminal of the select transistor 204 to be electrically connected to the fuse resistor 202 (which can be formed using the layout 500 of FIG. 5). Similarly, the layout includes patterns (not shown) configured to form a number of middle-end interconnect structures that are connected to the source terminals of the sub-transistors (equivalently the source terminal of the select transistor 204), respectively. Such MDs allow the source terminal of the select transistor 204 to be connected to a first back-end interconnect structure configured as the BL.

The layout 400 includes pattern 414 to form such a BL (hereinafter "BL 414"). The layout 400 further includes pattern 416 configured to form a second back-end interconnect structure configured as the WL (hereinafter "WL 416"), and pattern 418 configured to form a third back-end interconnect structure configured as the CDD (hereinafter "CDD 418"). Further, the WL 416 is electrically connected to the gate structures 408A-E (equivalently the gate terminal of the select transistor 204), and the CDD 418 is electrically connected to the NEW 406 (equivalently the cathode of the diode 206) through a number of middle-end interconnect structures formed based on patterns 420 (hereinafter "MDs 420").

Referring now to FIG. 5, the layout 500 includes patterns 502 and 504 configured to form a fourth back-end interconnect structure configured as the fuse resistor 202 and a fifth back-end interconnect structure configured as the SL, respectively. Hereinafter, the patterns 502 and 504 are referred to as "fuse resistor 202/502" and "SL 504," respectively. As reference, the patterns/structures 410A-C, 414, 416, and 418 of the layout 400 are also illustrated in the layout 500 shown in FIG. 5. The MDs 410A-C can be connected to the drain terminal of the select transistor 204 (i.e., the Y node of FIG. 2 which also connected to one terminal of the fuse resistor 202 and the anode of the diode 206); the BL 414 can be connected to the source terminal of the select transistor 204; the WL 416 can be connected to the gate terminal of the select transistor 204; and the CDD 418 can be connected to the cathode of the diode 206. In some embodiments, the BL 414, WL 416, CDD 418, fuse resistor 202/502, and SL 504 may be formed across multiple back-end metallization layers, which may be better illustrated in the perspective view of FIG. 8.

Figure 6:
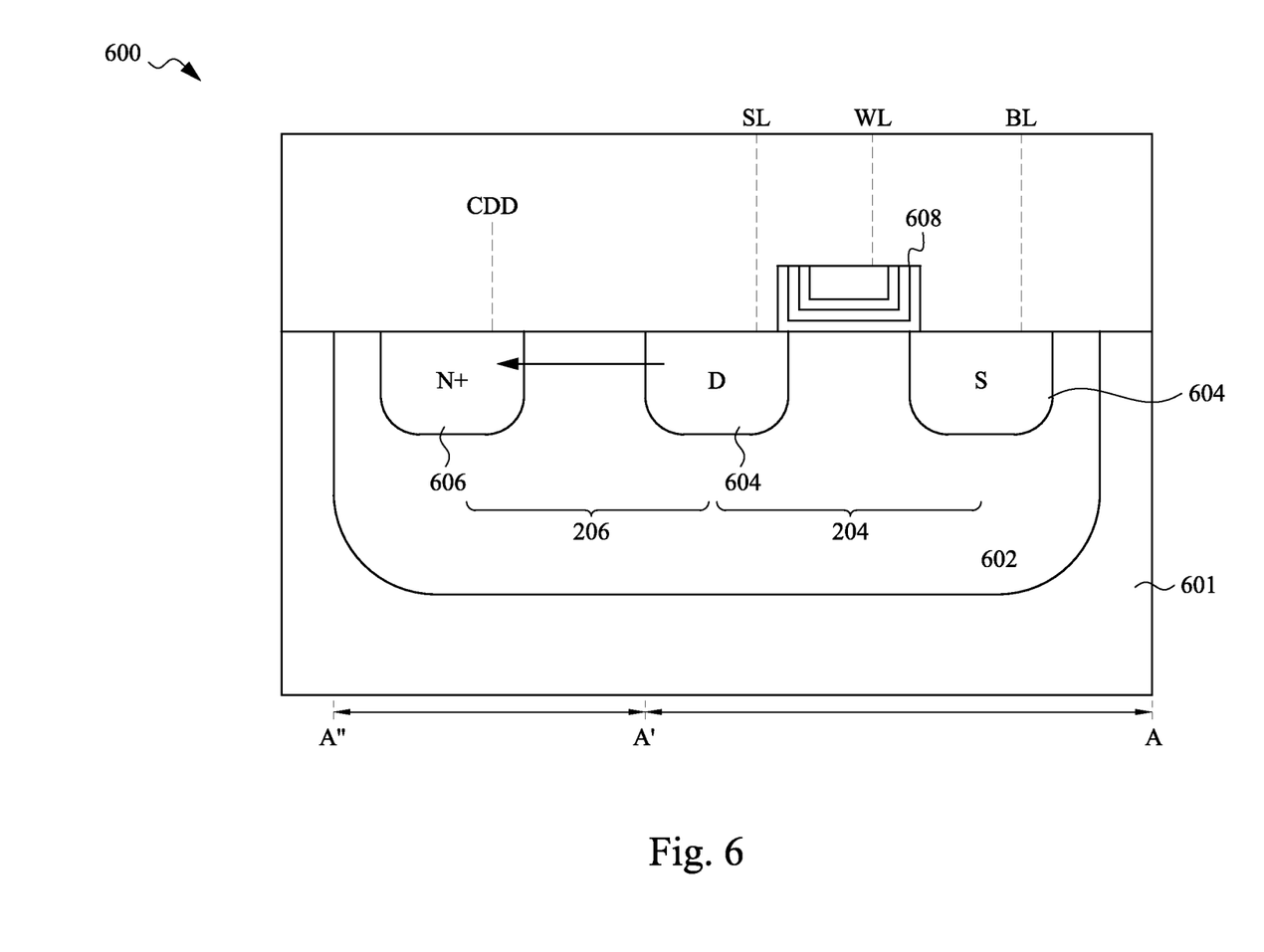
FIG. 6 illustrates a cross-sectional view of a semiconductor device formed based on the layout of FIGS. 4-5, in accordance with some embodiments.

FIG. 6 illustrates a cross-sectional view of a device 600 formed based on the layout 400. The cross-sectional view of FIG. 6 is cut along line A-A" indicted in FIG. 4, which includes a first portion extending along the X-direction (line A-A') and a second portion extending along the Y-direction (line A'-A"). As shown in FIG. 6, the device 600 includes a (e.g., p-type) substrate 601, an NW 602 (corresponding to the NW 402 of FIG. 4), a number of P Ws 604 (corresponding to the P$^+$Ws 404 of FIG. 4), an N$^+$W 606 (corresponding to the N$^+$W 406 of FIG. 4), and a gate structure 608 (corresponding to the gate structure 408 of FIG. 4). As such, the NW 602, P$^+$Ws 604, and gate structure 608 can serve as the channel, source and drain terminal, gate terminal of the select transistor 204, respectively; and one of the P$^+$Ws 604 and NW 606 can serve as the anode and cathode of the diode 206, respectively.

Figure 7:
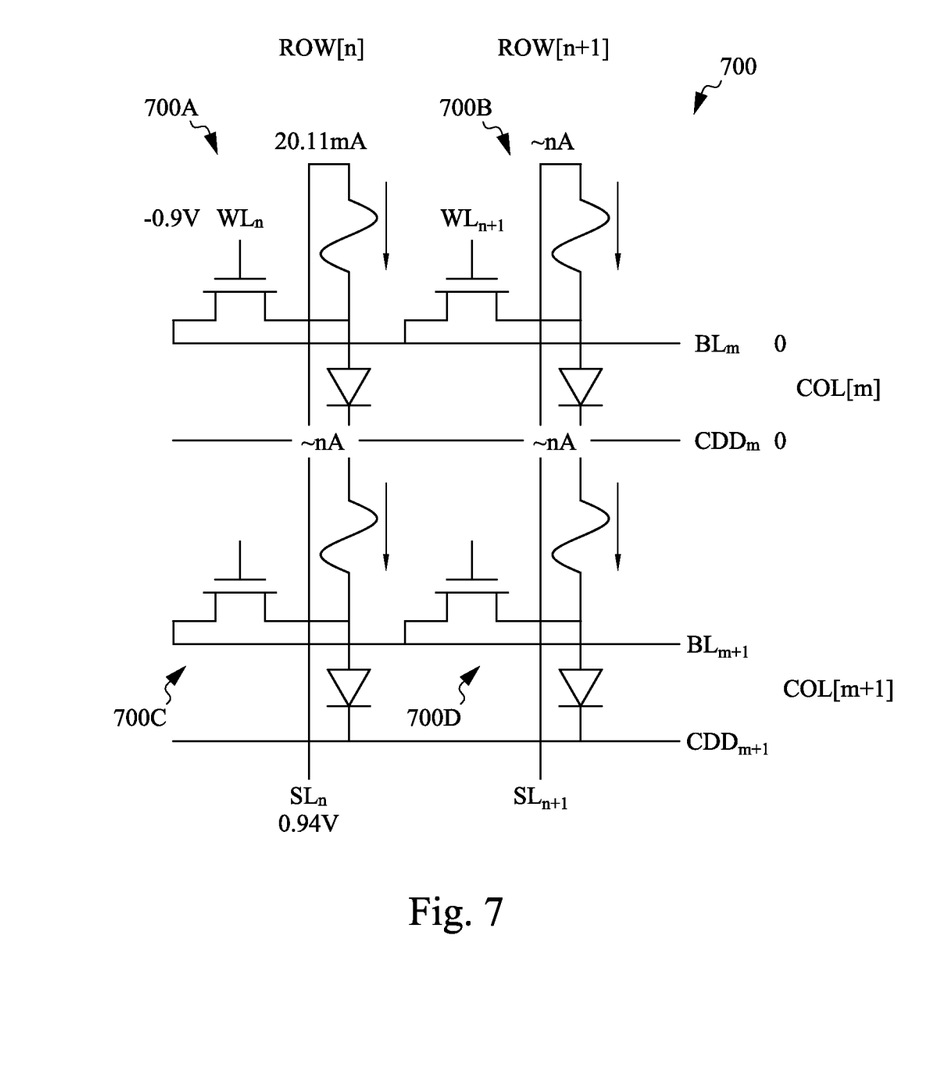
FIG. 7 illustrates a schematic diagram of a memory array having a plural number of the efuse memory cells of FIG. 2, in accordance with some embodiments.

FIG. 7 illustrates a schematic diagram of a memory array 700 having a plural number of efuse memory cells, e.g., 700A, 700B, 700C, and 700D, in accordance with some embodiments. Each of the efuse memory cells 700A to 700D can be implemented as the efuse memory cell 200 (FIG. 2), i.e., having a 1T1R1D structure. Although four efuse memory cells are shown in FIG. 7, it should be understood that the memory array 700 can include any number of efuse memory cells, while remaining within the scope of the present disclosure.

As shown, the efuse memory cells 700A to 700D are arranged over two rows, ROW[n] and ROW[n+1], and two columns, COL[m] and COL[m+1]. In some embodiments, each row includes a respective word line (WL) and a respective source line (SL); and each column includes a respective bit line (BL) and a respective current-divider line (CDD). For example in FIG. 7, ROW[n] includes $WL_n$ and $SL_n$; ROW[n] includes $WL_{n+1}$ and $SL_{n+1}$; COL[m] includes $BL_m$ and $CDD_m$; and COL[m+1] includes $BL_{m+1}$ and $CDD_{m+1}$. Each of the efuse memory cells 700A to 700D is located at an intersection of a corresponding row and a corresponding column. As such, each of the efuse memory cells 700A to 700D may be operatively connected to a corresponding combination of WL, SL, BL, and CDD.

By implementing each of the efuse memory cells 700A to 700D as a 1T1R1D structure, disturb current flowing through the unselected efuse memory cells can be significantly suppressed. For example of FIG. 7, the efuse memory cell 700A is selected for programming by applying Vprogram (e.g., about 0.94V) and −VDD (e.g., about −0.9V) on $SL_n$ and $WL_n$, respectively, with $BL_m$ and $CDD_m$ tying to 0V. The other efuse memory cells 700B to 700D are unselected by floating $SL_{n+1}$, $BL_{m+1}$, and $CDD_{m+1}$. As such, only the selected efuse memory cell 700A can conduct a current of about 20 milliamperes, while each of the unselected efuse memory cells 700B to 700D can only conduct a current in the range of nanoamperes. This is because the diode of each of the unselected efuse memory cells 700B to 700D is reverse-biased, thereby disconnecting almost all the possible leakage conduction paths coupled to the selected efuse memory cell 700A.

Figure 8:
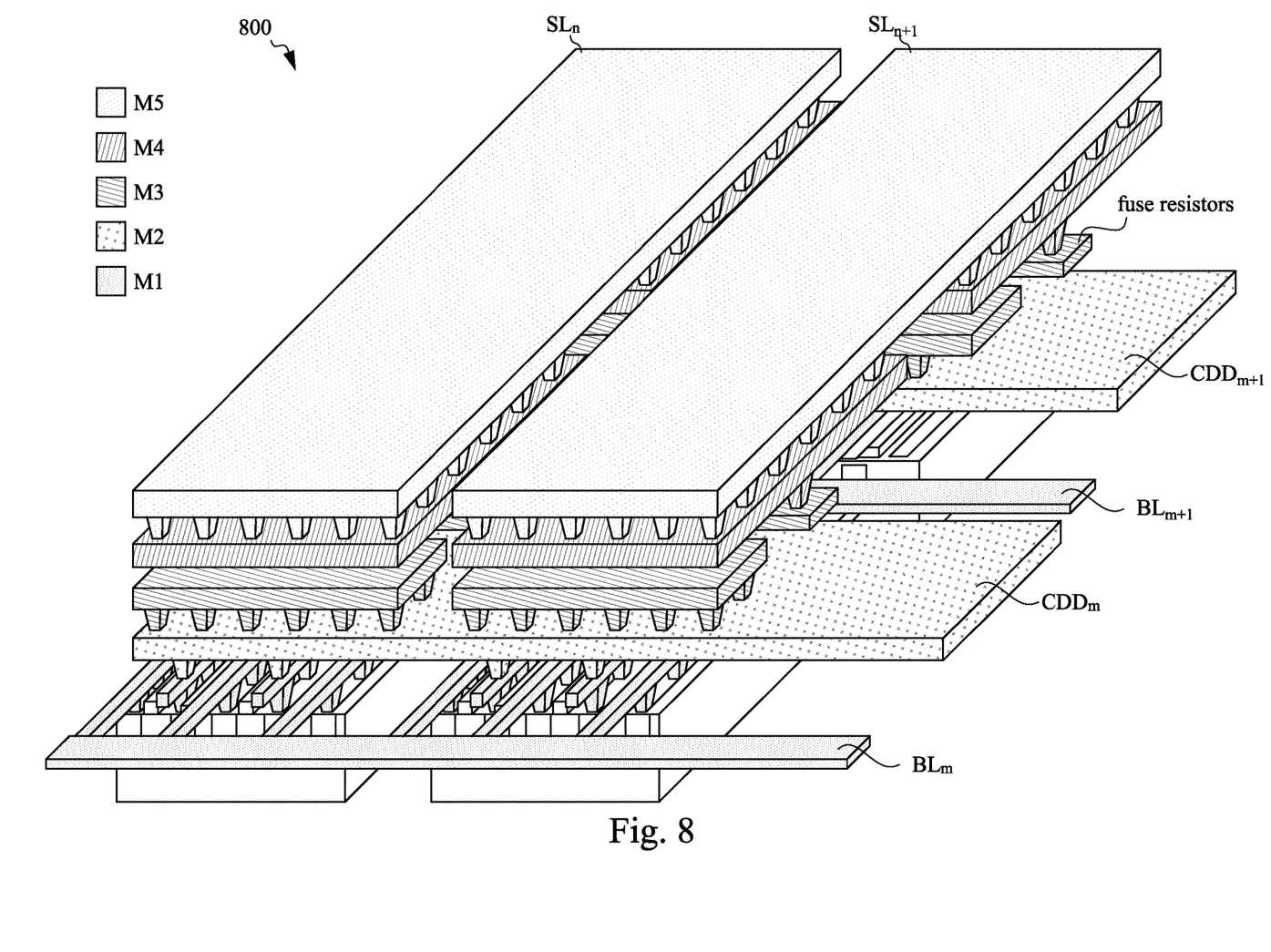
FIG. 8 illustrates a perspective view of a portion of a semiconductor device corresponding to the memory array of FIG. 7, in accordance with some embodiments.

FIG. 8 illustrates a perspective view of a device 800 corresponding to the memory array 700, in accordance with some embodiments. As shown, access lines (e.g., BLs, CDDs, SLs) may be disposed in respectively different metallization layers. For example, the $BL_m$ and $BL_{m+1}$ are disposed in a first metallization layer (e.g., M1); the $CDD_m$ and $CDD_{m+1}$ are disposed in a second metallization layer (e.g., M2); and the $SL_n$ and $SL_{n+1}$ are disposed in a third metallization layer (e.g., M5). In some embodiments, the respective fuse resistors of the memory cells 700A to 700D may be disposed between the second metallization layer and the third metallization layer (e.g., M3).

Figure 9:
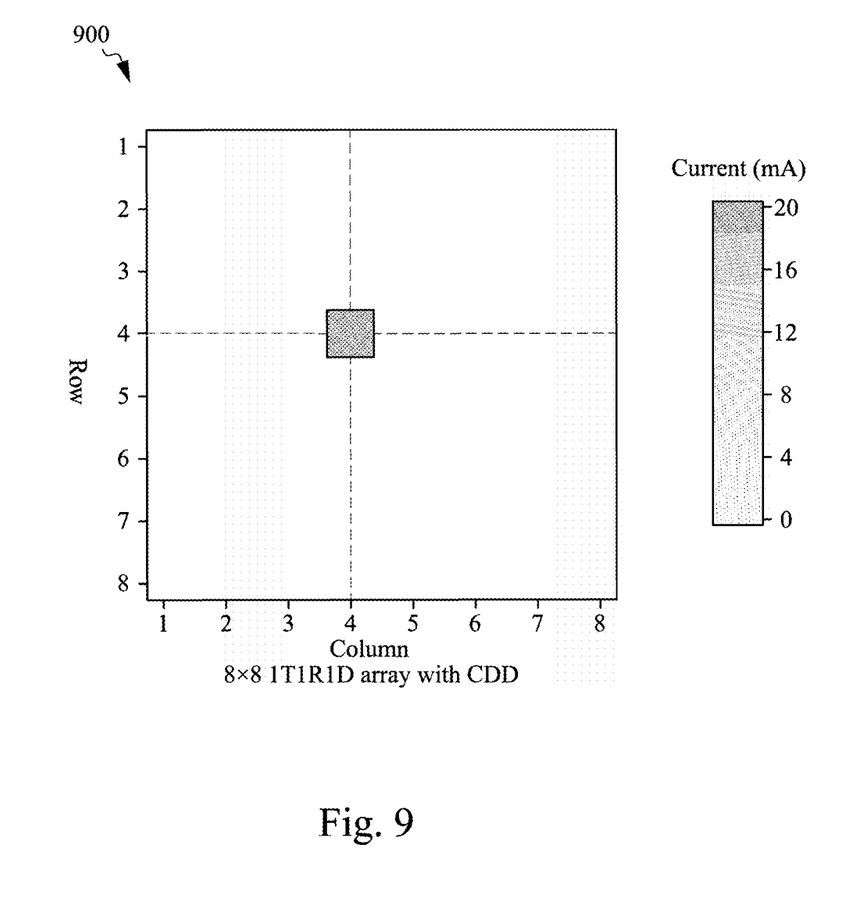
FIGS. 9 and 10 illustrate current distribution maps of a first memory array and a second memory array, respectively, in accordance with some embodiments.
Figure 10:
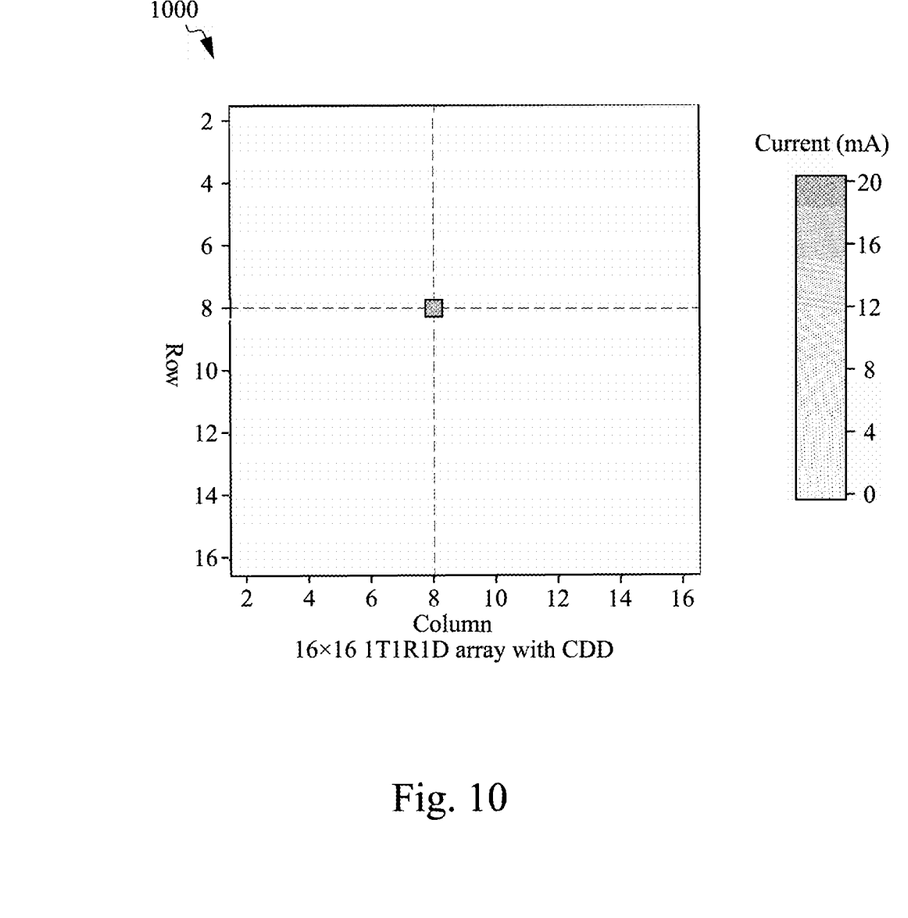

FIGS. 9 and 10 respectively illustrate current distribution maps, 900 and 1000, for a first memory array and a second memory array, in accordance with some embodiments. Each of the first memory array and the second memory array may include a plural number of the disclosed efuse memory cells (e.g., 200). For example, the first memory array includes 8×8 efuse memory cells; and the second memory array includes 16×16 efuse memory cells. Even with such a large array size, a current peak is only present at the selected efuse memory cell, while all the unselected efuse memory cells present almost zero current. In FIG. 9, only the selected cell at an intersection of the fourth column and the fourth row presents a detectable current level (e.g., in the range of milliamperes); and in FIG. 10, only the selected cell at an intersection of the eighth column and the eighth row presents a detectable current level (e.g., in the range of milliamperes). This is because when one of the efuse memory cells is selected, corresponding diodes of the other unselected efuse memory cells are reverse-biased. As such, disturb current flowing through the unselected efuse memory cells can be significantly depressed. In other words, a detectable current level may only present at the selected efuse memory cell of a memory array.

Figure 11:
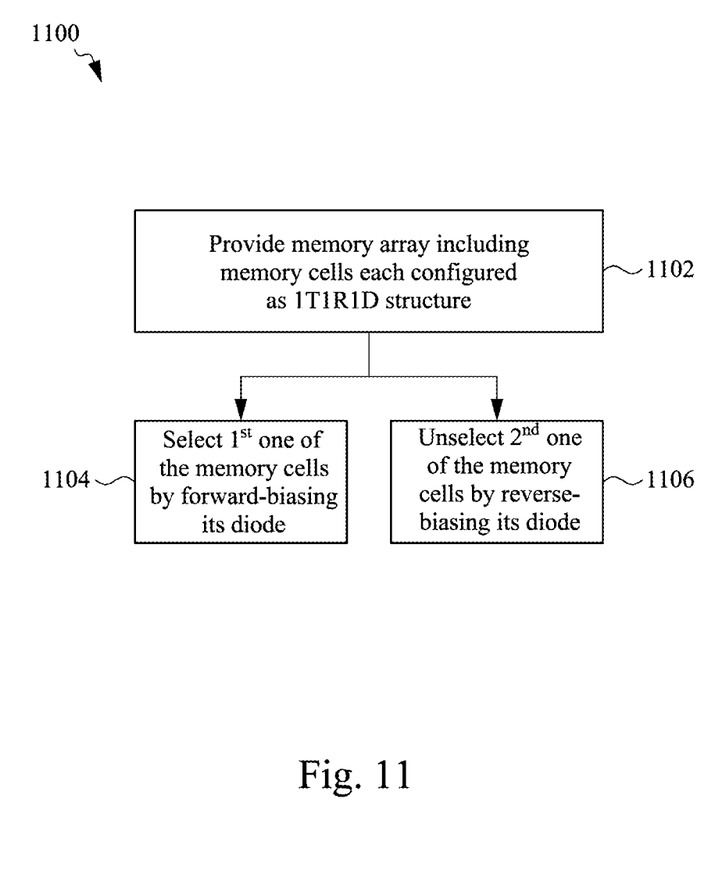
FIG. 11 illustrates a flow chart of an example method to operate the memory array of FIG. 7, in accordance with some embodiments.

FIG. 11 illustrates a flow chart of a method 1100 to operate a memory device having a memory array with a plural number of the disclosed efuse memory cells (e.g., 200), in accordance with some embodiments. The method 1100 may be used to operate a memory array including a plural number of the disclosed efuse memory cells, e.g., memory array 700. It is noted that the method 1100 is merely an example and is not intended to limit the present disclosure. Accordingly, it is understood that additional operations may be provided before, during, and after the method 1100 of FIG. 11, and that some other operations may only be briefly described herein.

The method 1100 starts with operation 1102 in which a memory array including a plural number of efuse memory cells is provided. Each of the efuse memory cells is implemented as a 1T1R1D structure that includes a select transistor (e.g., 204), a fuse resistor (e.g., 202), and a diode (e.g., 206). The fuse resistor is connected to the select transistor in series, with the diode connected to a common node between the select transistor and the fuse resistor. Alternatively stated, the fuse resistor is connected to the diode in series, with the select transistor connected to a common node between the diode and the fuse resistor.

Further, each of the efuse memory cells is operatively coupled to a corresponding combination of a SL, WL, BL, and CDD. By applying suitable signals to the corresponding SL, WL, BL, and CDD (e.g., according to the table 300 of FIG. 3), one of the efuse memory cells can be selected to be programmed with two conduction paths, while disturb current flowing through the remaining unselected efuse memory cells can be significantly suppressed. Using the efuse memory cell 200 of FIG. 2 as a representative example, when the select transistor 204 is turned on, one conduction path can be formed through the fuse resistor 202 (e.g., from the SL to the node Y) and the other conduction path can be formed through the diode 206 (e.g., further from the node Y to the CDD).

In some embodiments, the method 1100 continues to operation 1104 of selecting a first one of the efuse memory cells to be programmed by forward-biasing the diode of the first efuse memory cell. Using the memory array 700 of FIG. 7 as an example, the efuse memory cell 700A is selected for programming by applying Vprogram to $SL_n$ and −VDD to $WL_n$, respectively, and tying $BL_m$ and $CDD_m$ to 0V. As such, the diode of the efuse memory cell 700A can be forward-biased, which allows two conduction paths to be formed through the turned-on select transistor and the forward-biased diode, respectively. Concurrently with operation 1104, the method 1100 also continues to operation 1106 of unselecting a second one of the efuse memory cells to be programmed by reverse-biasing the diode of the second efuse memory cell. Continuing with the above example of FIG. 7, the efuse memory cells 700B to 700D are unselected for programming by floating $SL_{n+1}$ and $CDD_{m+1}$ and applying VDD to $WL_{n+1}$. As such, the diode of each of the efuse memory cells 700B to 700D can be reverse-biased. Thus, disturb current flowing through each of these unselected efuse memory cells can be greatly reduced.

In one aspect of the present disclosure, a memory device is disclosed. The memory device includes a first memory cell comprising: a first select transistor; a first diode; and a first conductor fuse. The first diode and the first conductor fuse are coupled in series, with the first select transistor coupled to a first common node between the first diode and the first conductor fuse.

In another aspect of the present disclosure, a memory device is disclosed. The memory device includes a memory array comprising a plurality of one-time-programmable (OTP) memory cells. Each of the plurality of OTP memory cells comprises: a select transistor; a diode; and a conductor fuse. The diode and the conductor fuse are coupled in series, with the select transistor coupled to a common node between the diode and the conductor fuse.

In yet another aspect of the present disclosure, a method for operating a memory device is disclosed. The method comprises: providing a memory array including a plurality of one-time-programmable (OTP) memory cells, each of the plurality of OTP memory cells comprising: (i) a select transistor; (ii) a diode; and (iii) a conductor fuse; selecting a first one of the plurality of OTP memory cells to be programmed by forward-biasing the diode of the first OTP memory cell; and unselecting a second one of the plurality of OTP memory cells to be programmed by reverse-biasing the diode of the second OTP memory cell.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first memory cell comprising:
        a first select transistor;
        a first diode; and
        a first conductor fuse;
    wherein the first diode and the first conductor fuse are coupled in series, with the first select transistor coupled to a first common node between the first diode and the first conductor fuse;
    a first word line coupled to a gate of the first select transistor;
    a first source line coupled to a first terminal of the first conductor fuse;
    a first bit line coupled to a first source/drain of the first select transistor; and
    a first current-divider line coupled to a first terminal of the first diode.

2. The memory device of claim 1, wherein the first memory cell is configured as an one-time-programmable memory cell, in which the first conductor fuse is configured to be permanently burned out.

3. The memory device of claim 1, wherein the first select transistor has a second source/drain coupled to the first common node.

4. The memory device of claim 1, wherein the first conductor fuse has a second terminal coupled to the first common node.

5. The memory device of claim 1, wherein the first diode has a second terminal coupled to the first common node.

6. The memory device of claim 1, wherein when programming the first conductor fuse, the first select transistor is turned on and the first diode is being forward-biased.

7. The memory device of claim 6, wherein the first source line is configured to apply a programming voltage on the first conductor fuse through the first source line, with the first bit line and the first current-divider line being coupled to a ground voltage.

8. The memory device of claim 7, further comprising a second memory cell comprising:
    a second select transistor;
    a second diode; and
    a second conductor fuse;
    wherein the second diode and the second conductor fuse are coupled in series, with the second select transistor coupled to a second common node between the second diode and the second conductor fuse.

9. The memory device of claim 8, further comprising:
    a second word line coupled to a gate of the second select transistor;
    a second source line coupled to a first terminal of the second conductor fuse, with a second terminal of the second conductor fuse coupled to the second common node;
    a second bit line coupled to a first source/drain of the second select transistor, with a second source/drain of the second select transistor coupled to the second common node; and
    a second current-divider line coupled to a first terminal of the second diode, with a second terminal of the second diode coupled to the second common node.

10. The memory device of claim 9, wherein when programming the first conductor fuse, the second select transistor is turned off and the second diode is being reverse-biased.

11. A memory device, comprising:
a memory array comprising:
a plurality of word lines;
a plurality of source lines;
a plurality of bit lines;
a plurality of current-divider lines; and
a plurality of one-time-programmable (OTP) memory cells, each of the plurality of OTP memory cells comprising:
a select transistor;
a diode; and
a conductor fuse;
wherein the diode and the conductor fuse are coupled in series, with the select transistor coupled to a common node between the diode and the conductor fuse, and each of the OTP memory cells is operatively coupled to a corresponding one of the word lines, a corresponding one of the source lines, a corresponding one of the bit lines, and a corresponding one of the current-divider lines.

12. The memory device of claim 11, wherein the conductor fuse of each of the OTP memory cells is configured to be permanently burned out.

13. The memory device of claim 11, wherein when a first one of the OTP memory cells is selected to be programmed, the diode of the first OTP memory cell is being forward-biased.

14. The memory device of claim 13, wherein when a second one of the OTP memory cells is unselected to be programmed, the diode of the second OTP memory cell is being reverse-biased.

15. The memory device of claim 14, wherein a current flowing through the unselected second OTP memory cell is in a range of nanoamperes.

16. A method for operating a memory device, comprising:
providing a memory array including a plurality of one-time-programmable (OTP) memory cells, each of the plurality of OTP memory cells comprising: (i) a select transistor; (ii) a diode; and (iii) a conductor fuse;
selecting a first one of the plurality of OTP memory cells to be programmed by forward-biasing the diode of the first OTP memory cell; and
unselecting a second one of the plurality of OTP memory cells to be programmed by reverse-biasing the diode of the second OTP memory cell, wherein a current flowing through the unselected second one of the plurality of OTP memory cells is in a range of nanoamperes.

17. The method of claim 16, wherein the conductor fuse of each of the OTP memory cells is configured to be permanently burned out.

18. The method of claim 16, wherein the memory array further comprises:
a word line coupled to a gate of the select transistor of the first one of the plurality of OTP memory cells;
a source line coupled to a first terminal of the conductor fuse of the first one of the plurality of OTP memory cells;
a bit line coupled to a first source/drain of the select transistor of the first one of the plurality of OTP memory cells; and
a current-divider line coupled to a first terminal of the diode of the first one of the plurality of OTP memory cells.

19. The memory device of claim 10, wherein a current flowing through the second memory cell is in a range of nanoamperes when programming the first conductor fuse.

20. The memory device of claim 11, wherein the bit lines extend in a first direction, and the current-divider lines extend in the first direction.

* * * * *